United States Patent
Sezi et al.

(10) Patent No.: US 7,211,856 B2
(45) Date of Patent: May 1, 2007

(54) RESISTIVE MEMORY FOR LOW-VOLTAGE APPLICATIONS

(75) Inventors: Recai Sezi, Roettenbach (DE); Andreas Walter, Egloffstein (DE); Reimund Engl, Nuremberg (DE); Anna Maltenberger, Leutenbach (DE); Joerg Schumann, Dresden (DE); Thomas Weitz, Bad Duerkheim (DE)

(73) Assignee: Infineon Technologies AG, Munich (DE)

( * ) Notice: Subject to any disclaimer, the term of this patent is extended or adjusted under 35 U.S.C. 154(b) by 164 days.

(21) Appl. No.: 11/041,760

(22) Filed: Jan. 24, 2005

(65) Prior Publication Data

US 2005/0186737 A1 Aug. 25, 2005

(30) Foreign Application Priority Data

Jan. 27, 2004 (DE) ............... 10 2004 004 047

(51) Int. Cl.
*H01L 27/108* (2006.01)
*H01L 21/8242* (2006.01)

(52) U.S. Cl. ............... 257/310; 257/304; 257/311; 257/300; 438/250; 438/393

(58) Field of Classification Search ........ 257/314–316; 438/250–256, 243–244, 386–387, 393–394, 438/396–397
See application file for complete search history.

(56) References Cited

U.S. PATENT DOCUMENTS 5,350,537 A * 9/1994 Itoh et al. ............ 252/299.01

OTHER PUBLICATIONS

C.P. Jarrett et al., Field Effect Measurements in Doped Conjugated Polymer Films: Assessment of Charge Carrier Mobilities, 1995 American Institute of Physics, Jun. 15, 1995, pp. 6289-6294.

* cited by examiner

*Primary Examiner*—Dung A. Le
(74) *Attorney, Agent, or Firm*—Dicke, Billig & Czaja, PLLC

(57) ABSTRACT

Memory cells having two electrodes and a layer arranged in between and including an active material which contains hexakisbenzylthiobenzene, dichlorodicyano-p-benzoquinone and optionally a polymer are provided. Furthermore, a process for the production of the cells according to the invention is provided, as well as the novel use of a composition which can be used as active material for the memory cells.

23 Claims, 2 Drawing Sheets

RESISTIVE MEMORY FOR LOW-VOLTAGE APPLICATIONS

CROSS-REFERENCE TO RELATED APPLICATIONS

This Utility Patent Application claims priority to German Patent Application No. DE 10 2004 004 047.8, filed on Jan. 27, 2004, which is incorporated herein by reference.

FIELD OF THE INVENTION

The invention relates to a semiconductor arrangement comprising a resistive memory for low-voltage applications.

BACKGROUND

One of the substantial efforts in the further development of modern storage technologies is the increase of the integration density, so that the reduction in the structure sizes of the memory cells on which the memory devices are based is very important. Further efforts consist in developing novel memory cells which can be switched at relatively low voltages. A plurality of microelectronic elements and in particular memory cells which have a size of a few nanometers has been described in recent years. A concept for designing such memory cells is to arrange, between two electrodes, an active layer which can reversibly change certain properties, such as, for example, ferromagnetic properties or electrical resistance, depending on the voltage. Depending on the applied voltage, the cell can be switched between two states, so that one state can be assigned, for example, to the information state "0" and the other state can be assigned to the information state "1".

Various memory cells having an active layer have been described in the prior art.

Compared with the cells which have a ferroelectric material between two electrodes, the cell which has, between two electrodes, an active layer which can change the electrical resistance depending on the applied voltage has the advantage that it has a substantially higher signal ratio between the OFF and ON state and need not be rewritten after the read process, since the reading of the state is not destructive.

Bandyopdhyay et al.: Applied Physics Letters, Vol. 82, pages 1215–1217 entitled, "Large conductance switching memory effects in organic molecules for data-storage applications" describes an active layer arranged between two electrodes and consisting of rose Bengal (4,5,6,7-tetrachloro-2', 4',5',7'-tetraiodofluorescein) with a polyallylamine hydrochloride polymer. The electrode consists of indium tin oxide on glass. The production of the active layer is, however, very inconvenient and requires treatment in an oven for several hours in vacuo. In addition, the active layer is limited to the indium tin oxide electrode.

A further memory cell comprising an active material which exhibits switchable behavior is described in Yang et al.: Applied Physics Letters, Vol. 80, 2002, pages 2997–2999 entitled, "Organic Electrical Bistable Devices and Rewritable Memory Cells". The active material consists of 2-amino-4,5-imidazoledicarbonitrile (AIDCN). The memory cell according to this prior art consists of a plurality of layers which have the following composition: an aluminium alloy deposited on glass, an AIDCN layer arranged thereon, a metal layer, a further AIDCN layer and a cathode. For switchability, this system requires the five layers described above, which makes the production very complex.

A further disadvantage of the cells according to this prior art is that the cells can be switched only with aluminium electrodes and that the active layer can be applied only by means of vacuum vapour deposition.

According to C. P. Jarrett et al. in "Field effect measurements in doped conjugated polymer films: Assessment of charge carrier mobilities," in J. Appl. Phys. 77(12), 15 Jun. 1995, pages 6289–6294, the conductivity and the field effect mobility are measured using metal-insulator-semiconductor field effect transistors and acceptor density measurements are carried out using metal-insulator-semiconductor diodes. The measurements were carried out on thin polymer films of the organic semiconductor poly(beta'-dodecyloxy-alpha,alpha',alpha',alpha"-terthienyl), which were doped with different conductivities using 2,3-dichloro-5,6-dicyano-1,4-benzoquinone (DDQ) as an oxidizing agent. It was found that the field effect mobility and the conductivity of these films increased superlinearly on doping, whereas the transistor amplification, i.e. the ON/OFF ratio, decreased.

SUMMARY

The present invention provides memory cells having a active layer between two electrodes, the memory cells permitting a high integration density, being capable of being switched between two stable states of different electrical resistance and being easy to process.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides memory cells comprising an active layer arranged between two electrodes, the memory cells permitting a high integration density, being capable of being switched between two stable states of different electrical resistance, being easy to process by conventional methods in microelectronics and allowing the use of the electrodes customary in microelectronics.

Embodiments of the invention also provide memory cells which can be switched at very low voltage.

Embodiments of the invention provide novel active materials which can be used in the memory cells.

Figure 1:
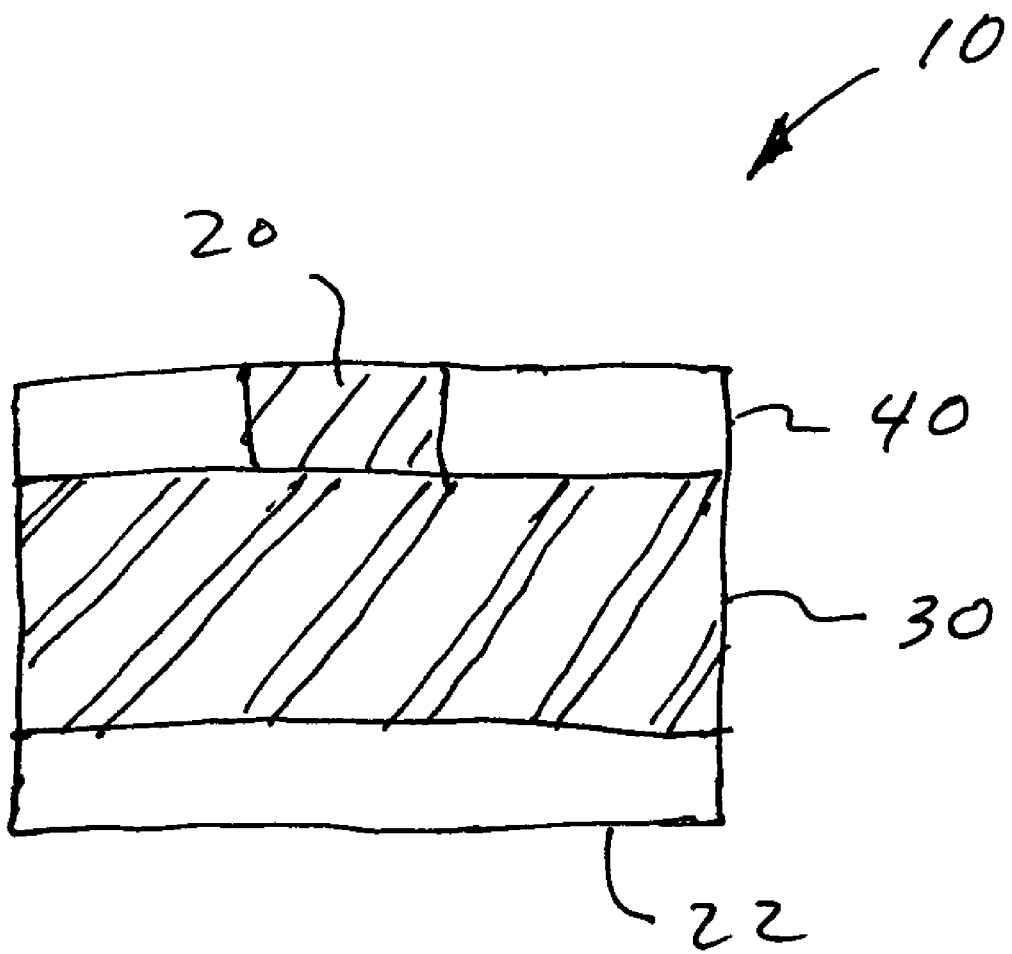
FIG. 1 is a diagram illustrating one embodiment of a memory cell according to the invention.

In one embodiment illustrated in the diagram of FIG. 1, the invention provides by a memory cell 10 comprising two electrodes 20,22 and an active layer 30 arranged in between, the active layer comprising: (a) hexakisbenzylthiobenzene (CAS: 127022-77-9), (b) dichlorodicyano-p-benzoquinone (DDQ) and, optionally (c) a polymer.

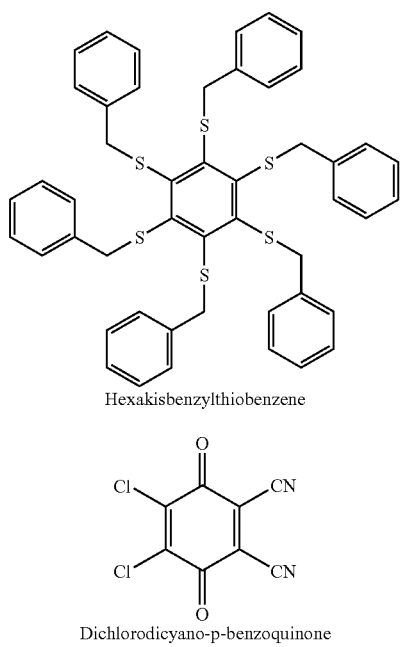

The advantages of the cell design according to the invention are reversible switchability, a ratio of the ON to OFF resistances of 10 or more, nondestructive reading since there is no necessity of rewriting after reading, nonvolatile information storage, functionality down to film thicknesses of about 20 nm, high thermal stability, switchability in the presence of air and moisture, simple and economical design of the cell and suitability of the memory cell for production in a plurality of layers, such as, for example, by the copper damascene technique.

The ratio of the component (a) to (b) can be varied within wide ranges. In one embodiment, the ratio of (a) to (b) is in the range from 1:4 to 4:1.

The amount by weight of the polymer, based on the total amount of the active material, is in the range from 0 to 70% by weight.

In one embodiment, the amount by weight of the polymer, based on the total amount of the active material, is in the range from 25 to 60% by weight.

The optionally used polymer preferably serves as a film-forming carrier material and is not of decisive importance for the activity of the active material. In general, it is possible to use any polymer which has electronically insulating properties and is compatible with the components (a) and (b).

Particularly preferred polymers are, for example, polyether, polyacrylates, polyether sulphone, polyether sulphide, polyether ketone, polyquinolines, polyquinoxalines and polybenzoxazoles, polybenzimidazoles or polyimides or precursors thereof.

The polymer may be in the form of either a homopolymer or a copolymer having further polymerizable repeating units. The polymer may be present alone or as a blend of different polymers.

The substrate 40 on which the electrodes have been applied or in which the electrodes were incorporated may be silicon, germanium, gallium arsenide or gallium nitride or any desired material which contains any desired compound of silicon, germanium or gallium. Furthermore, the substrate may also be a polymer, i.e. plastic, which is filled or unfilled or is present as a moulding or film, and may be ceramic, glass or metal. The substrate may also be a preprocessed material and contain one or more layers of contacts, conductor tracks, insulating layers and further microelectronic components.

In one embodiment, the substrate is silicon which has already been processed according to front-end-of-line (FEOL), i.e. already contains electric components, such as transistors, capacitors, etc.—manufactured by the silicon technique. An insulating layer is preferably present between the substrate and the nearest electrode, particularly when the substrate is electrically conductive. However, it is also possible for a plurality of layers to be present between the substrate and the nearest electrode.

The substrate may serve as carrier material or may perform an electrical function (evaluation, control). For the last-mentioned case, there are electrical contacts between the substrate and the electrodes which are applied to the substrate. These electrical contacts are, for example, contact holes (vias) filled with an electrical conductor. However, it is possible for the contacts to be effected from the lower into the upper layers by metallization in the edge regions of the substrate or of the chips.

The active layer according to the invention is compatible with a multiplicity of electrodes conventionally used in microelectronics. Electrodes preferably consist of Cu, Al, AlCu, AlSiCu, Ti, TiN, Ta, TaN, W, TiW, TaW, WN, WCN and customary combinations of these electrodes. Furthermore, thin layers of silicon, titanium silicon nitride, silicon oxynitride, silicon oxide, silicon carbide, silicon nitride or silicon carbonitride may also be present in combination with the abovementioned layers or materials.

The abbreviations, such as, for example, TiN, do not reproduce an exact stoichiometric ratio since the ratio of the components can be changed as desired within possible limits.

Various methods are suitable for depositing the abovementioned electrode layers. These may be, for example, PVD, CVD, PECVD, vapour deposition, electroplating, electroless plating or atomic layer deposition (ALCVD). However, the methods are not limited to these and it is in principle possible to use all methods used in microelectronics for the production of electrodes.

The deposition of the electrode can be effected from the gas phase or from solution.

The electrodes can be structured by means of various customary techniques. The structuring can be effected, for example, by means of hole masks, printing techniques or lithography. In particular, screen printing, microcontact printing and nanoimprinting are particularly preferred as printing techniques.

However, the electrodes can also be structured, for example, by means of the so-called damascene technique. For this purpose, for example, an insulating layer (preferably of silicon oxide) present above the substrate is structured by lithography and etching. After stripping of the photoresist, the electrode layer is deposited so that the trenches or holes in the insulating layer which are formed during the structuring are completely filled with the electrode materials. A part of these materials which projects above the surface of the insulating layer is then ground back. The grinding process can be effected by means of the so-called CMP technique (chemical mechanical planarization). This results in, for example, conductor tracks and/or contact holes which are filled with the electrode materials and embedded in the insulating layer so that they have the same height as the insulating layer.

After the active material is deposited onto the electrode, the top electrode can be produced in exactly the same way as the bottom one. In a preferred embodiment of the invention, the upper conductor tracks are arranged transversely to the lower conductor tracks. Thus, a so-called crosspoint cell, which consists of three layers, namely bottom electrode, active material and top electrode, forms at each point of intersection of the top electrode with the bottom electrode.

The lateral geometry of the cell is not limited to the abovementioned crosspoint arrangement; since, however, the crosspoint arrangement permits a very high integration density, it is preferred for the present invention.

The above-described sandwich structures of the memory cells, consisting of two electrodes and the layer present in between and comprising the active material, can be applied to the substrate not just once but several times in a form stacked one on top of the other. This results in a plurality of planes for the memory cells, each plane consisting of two electrodes and the layer present in between and comprising the active material. It is of course also possible for a plurality of cells to be in a plane (cell array). The various planes can be separated from one another by an insulator, or it is also possible to use not four but three electrodes for two planes located one on top of the other, since it (middle electrode) can serve as the top electrode for the lower plane and as the bottom electrode for the upper plane.

The active material can be applied to the electrode, for example, by preparation of a solution which contains the components (a) and (b) and optionally a polymer. Suitable solvents are, for example, N-methylpyrrolidone, γ-butyrolactone, methoxypropyl acetate, ethoxyethyl acetate, cyclohexanone, cyclopentanone, ethers of ethylene glycol, such as diethylene glycol diethyl ether, ethoxyethyl propionate or ethyl lactate. A mixture of the abovementioned solvents with optionally further solvents can also be used as the solvent. The formulation may also contain additives, such as, for example, adhesion promoters (for example silanes).

The active material can, however, also be applied by means of vacuum vapour deposition. For this purpose, the components (a) and (b) are deposited simultaneously on the electrode (co-evaporation) or the components are applied directly in succession and thus form the active layer without a polymer.

After spin coating or vacuum vapour deposition, a heating step is effected in each case, for example on a hotplate or in an oven, in order to dry the film or optionally to complete the reaction, particularly when the components (a) and (b) are deposited on the electrode by means of vacuum vapour deposition. In the case of vacuum vapour deposition, the thermal treatment can, however, also be carried out in a vacuum chamber or even omitted.

The thickness of the layer which contains the active material is in the range of, preferably, from between 20 and 2000 nm, the range between 20 and 200 nm being particularly preferred.

The advantages of the cell according to the invention are that the layer can be switched at very low voltages which are preferably less than one volt, which is compatible with the future memory designs and permits only a low energy consumption.

The further advantage is that the design of the cell is very simple so that the production can be effected economically. The cell has a reversible, reproducible switchability under various conditions, such as, for example, in the presence of air and moisture and in a wide temperature range.

The adhesion of the layer to the electrodes is outstanding and the ratio of the state with higher resistance to the state of low resistance is higher than 10. The production can be effected by means of customary lithograph processes since the active layer is compatible with a multiplicity of processes. A particular advantage of the present cell is that the active layer is compatible with customary electrodes. The active layer is switchable with the electrodes and electrode combinations which are used in microelectronics, and the fact that the switchability is very reliable particularly with copper should be emphasized. This is important because copper has the lowest electrical resistance compared with the other electrical conductors which are used as standard in electronics. The production of the cell according to the invention is explained in more detail with reference to examples.

EXAMPLES

Example 1

Production of the Bottom Electrode

The metal of the bottom electrode is applied to a silicon wafer having an insulating SiO or SiN surface by means of a vapour deposition method in a high vacuum or by a sputter method. Metals used may be all metals relevant in microelectronics, such as, for example, copper, aluminium, gold, titanium, tantalum, tungsten, titanium nitride or tantalum nitride. The structuring of the metals can be effected either by application of the metals via shadow masks or by lithographic structuring with subsequent etching by known methods of the metals applied over the entire surface.

Example 2

Preparation of Polymer Solutions 25 g of polyether, polyether sulphone, polyether ketone, polyimide, polybenzoxazole, polybenzimidazole or polymethacrylate are dissolved in 2.27 g of dichlorodicyano-p-benzoquinone and 8.11 g of hexakisbenzylthiobenzene in 70 g of distilled N-methylpyrrolidone or distilled γ-butyrolactone. The dissolution process is expediently effected on a shaking apparatus at room temperature. The solution is then filtered under pressure through a 0.2 μm filter into a cleaned, particle-free glass sample tube. The viscosity of the polymer solution can be changed by varying the dissolved mass of polymer.

Example 3

Preparation of Polymer Solutions 20 g of polyether, polyether sulphone, polyether ketone, polyimide, polybenzoxazole, polybenzimidazole or polymethacrylate are dissolved in 2.27 g of dichlorodicyano-p-benzoquinone and 4.07 g of hexakisbenzylthiobenzene in 60 g of distilled N-methylpyrrolidone or distilled γ-butyrolactone. The dissolution process is expediently effected on a shaking apparatus at room temperature. The solution is then filtered under pressure through a 0.2 μm filter into a cleaned, particle-free glass sample tube. The viscosity of the polymer solution can be changed by varying the dissolved mass of polymer.

Example 4

Preparation of Polymer Solutions 10 g of polyether, polyether sulphone, polyether ketone, polyimide, polybenzoxazole, polybenzimidazole or polymethacrylate are dissolved in 1.15 g of dichlorodicyano-p-benzoquinone and 5 g of hexakisbenzylthiobenzene in 50 g of distilled N-methylpyrrolidone or distilled γ-butyrolactone. The dissolution process is expediently effected on a shaking apparatus at room temperature. The solution is then filtered under pressure through a 0.2 μm filter into a cleaned, particle-free glass sample tube. The viscosity of the polymer solution can be changed by varying the dissolved mass of polymer.

Example 5

Improvement of the Adhesion by Adhesion Promoter Solutions

By using adhesion promoters, the adhesion of the polymers to surfaces relevant in microelectronics, such as, for example, silicon, silicon oxide, silicon nitride, tantalum nitride, tantalum, copper, aluminium, titanium or titanium nitride, can be improved.

For example, the following compounds can be used as adhesion promoters:

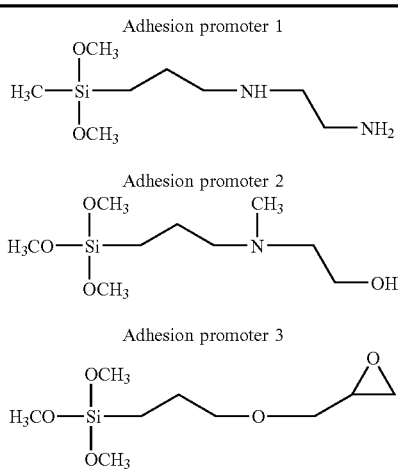

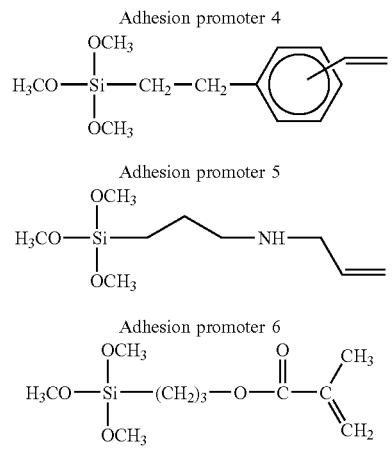

0.5 g of adhesion promoter (e.g. N-(2-aminoethyl)-3-aminopropylmethyldimethoxysilane) is dissolved in 95 g of methanol, ethanol or isopropanol and 5 g of demineralized water in a cleaned, particle-free glass sample tube at room temperature. After standing for 24 h at room temperature, the adhesion promoter solution is ready for use. This solution can be used for at most 3 weeks. The adhesion promoter should give a monomolecular layer on the surface. The adhesion promoter can expediently be applied by the spin coating technique. For this purpose, the adhesion promoter solution is applied via a 0.2 μm prefilter and applied by spin coating for 30 s at 5000 rpm. A drying step is then effected for 60 s at 100° C.

Example 6

Application of a Polymer by the Spin Coating Method

On the silicon wafer processed according to example 1 or possibly processed silicon wafers pretreated according to example 5, the filtered solution of the polymer according to examples 2 to 4 is applied to the wafer by means of a syringe and distributed uniformly by means of a spin coater. The layer thickness should be in the range of 50–500 nm. The polymer is then heated on a hotplate for 1 min at 120° C. and for 4 min to 200° C.

Example 7

Vapour Deposition of the Active Components

In addition to the method for the application of the dissolved active components (donor and acceptor) in a polymer by spin coating, the components hexakisbenzylthiobenzene and dichlorodicyano-p-benzoquinone can also be applied by the generally known method of co-evaporation. The two components hexakisbenzylthiobenzene and dichlorodicyano-p-benzoquinone are co-evaporated as far as possible in a molar ratio of 1:1 up to a layer thickness of 10–300 nm onto the silicon wafer processed according to example 1. The wafer should be cooled to 10–30° C. thereby.

Example 8

Production of the Top Electrode Via a Shadow Mask

The metal of the top electrode is applied via a shadow mask by a vapour deposition method in a high vacuum or by a sputter method onto the silicon wafer processed according to example 6 or 7. Metals which may be used are all metals relevant in microelectronics, such as, for example copper, aluminium, gold, titanium, tantalum, tungsten, titanium nitride or tantalum nitride.

Example 9

Production of the Top Electrode by a Lithographic Process

The metal of the top electrode is applied by a vapour deposition method in a high vacuum or by a sputter method to the entire surface of the silicon wafer processed according to example 6 or 7. Metals which may be used are all metals relevant in microelectronics, such as, for example copper, aluminium, gold, titanium, tantalum, tungsten, titanium nitride or tantalum nitride. For structuring the top electrode, a photoresist is applied to the metal by a spin-on method and is exposed to light and structured. The metal not covered by the photoresist is then removed by etching by known methods. The photoresist still present is removed using a suitable stripper.

Example 10

Production of the Top Electrode by a Lift-off Method

A photoresist is applied by known methods to the silicon wafer processed according to example 6 or 7 and is exposed to light and structured. The metal of the top electrode is then applied to the entire surface by a vapour deposition method in a high vacuum or by a sputter method. Metals which may be used are all metals relevant in microelectronics, such as, for example, copper, aluminium, gold, titanium, tantalum, tungsten, titanium nitride or tantalum nitride. The photoresist and the metal adhering to it are removed by a lift-off process.

Example 11

Measurement of the I(U) Characteristic

Figure 2:
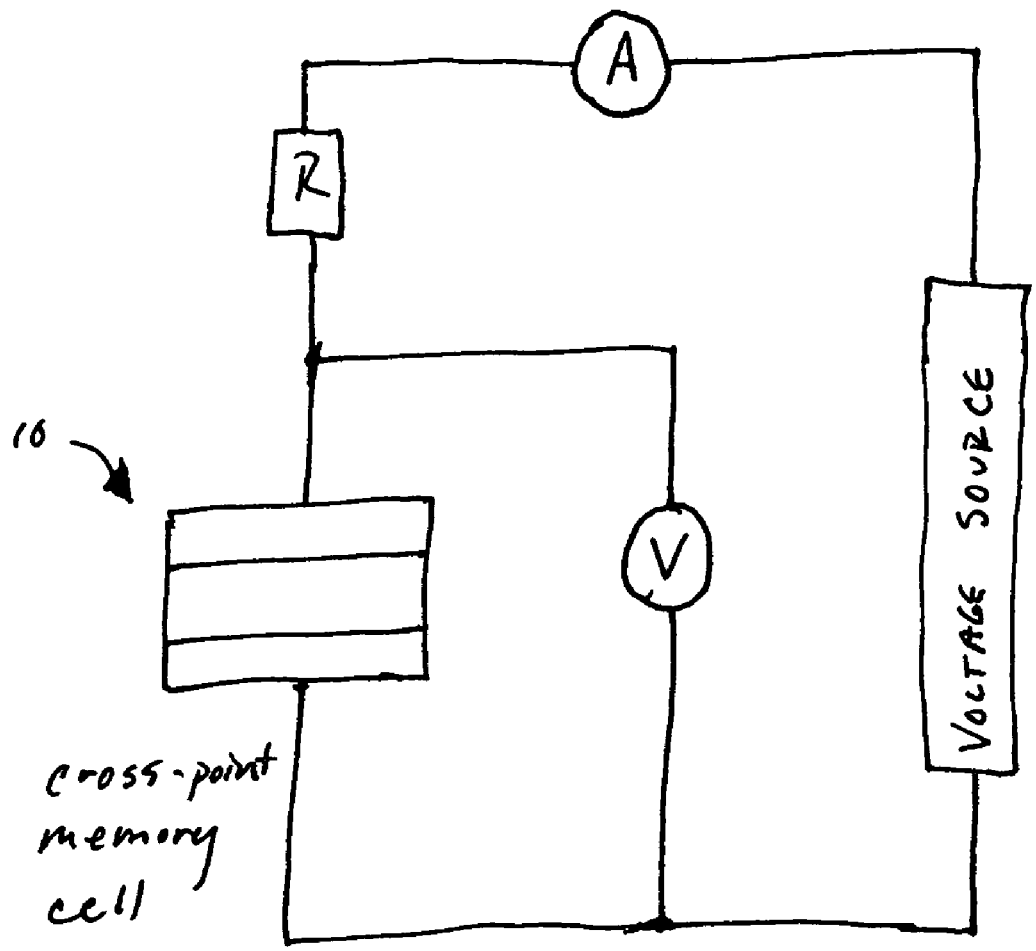
FIG. 2 is a diagram illustrating one embodiment of a measuring circuit for use with the invention.

In one embodiment, the measurement of the I(U) characteristic is effected according to the circuit diagram of FIG. 2.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell comprising:
   a first electrode;
   a second electrode; and
   an active layer which is arranged between the first and the second electrode, the active layer comprising hexakisbenzylthiobenzene and dichlorodicyano-p-benzoquinone.

2. The memory cell of claim 1, comprising the ratio of the hexakisbenzylthiobenzene to dichlorodicyano-p-benzoquinone is from 1:4 to 4:1.

3. The memory cell of claim 1, the active layer further comprising a polymer.

4. The memory cell of claim 3, comprising the amount by weight of the polymer, based on the total amount of the active material, is in the range between 0 and 70% by weight.

5. The memory cell of claim 3, comprising wherein the polymer is a film forming carrier material.

6. The memory cell of claim 3, comprising wherein the polymer is selected from the group consisting of polyether, polyacrylate, polyether sulphone, polyether sulphide, polyether ketone, polyquinoline, polyquinoxaline, polybenzoxazole, polybenzimida-zole or polyimide.

7. The memory cell of claim 1, comprising wherein the memory cell is applied to a substrate selected from the group consisting of silicon, germanium, gallium arsenide, gallium nitride, any desired compound of silicon, germanium or gallium, a polymer, ceramic, glass or metal.

8. The memory cell of claim 1, comprising the thickness of the active layer is between 20 and 2000 nm.

9. The memory cell of claim 7, comprising wherein the thickness of the active layer is between 20 and 200 nm.

10. The memory cell of claim 1, comprising wherein the first and/or second electrode consists of copper, aluminium, aluminium-copper, aluminium-silicon-copper, titanium, tantalum, tungsten, titanium nitride, TiW, TaW, WN, WCN or tantalum nitride and combinations thereof.

11. The memory cell of claim 1, comprising wherein the first electrode is rotated by 40 degrees to 140 degrees relative to the second electrode.

12. The memory cell of claim 11, wherein the first electrode is rotated by 90 degrees relative to the second electrode.

13. The memory cell of claim 11, wherein the first electrode is rotated by substantially 90 degrees relative to the second electrode.

14. A memory comprising:
    a first electrode;
    a second electrode;
    an active layer which is arranged between the first and the second electrode, the active layer comprising hexakisbenzylthiobenzene and dichlorodicyano-p-benzoquinone; and
    a substrate selected from the group consisting of silicon, germanium, gallium arsenide, gallium nitride, any desired compound of silicon, germanium or gallium, a polymer, ceramic, glass or metal.

15. The memory of claim 14, comprising the ratio of the hexakisbenzylthiobenzene to dichlorodicyano-p-benzoquinone is from 1:4 to 4:1.

16. The memory of claim 14, the active layer further comprising a polymer.

17. The memory cell of claim 16, comprising the amount by weight of the polymer, based on the total amount of the active material, is in the range between 0 and 70% by weight.

18. The memory cell of claim 17, comprising wherein the polymer is a film forming carrier material.

19. The memory cell of claim 16, comprising wherein the polymer is selected from the group consisting of polyether, polyacrylate, polyether sulphone, polyether sulphide, polyether ketone, polyquinoline, polyquinoxaline, polybenzoxazole, polybenzimida-zole or polyimide.

20. The memory cell of claim 14, comprising the thickness of the active layer is between 20 and 2000 nm.

21. The memory cell of claim 20, comprising wherein the thickness of the active layer is between 20 and 200 nm.

22. The memory cell of claim 21, comprising wherein the first and/or second electrode consists of copper, aluminium, aluminium-copper, aluminium-silicon-copper, titanium, tantalum, tungsten, titanium nitride, TiW, TaW, WN, WCN or tantalum nitride and combinations thereof.

23. A memory cell comprising:
a first electrode;
a second electrode; and
means for switching a state of the memory cell, including an active layer which is arranged between the first and the second electrode, the active layer comprising hexakisbenzylthiobenzene and dichlorodicyano-p-benzoquinone.

* * * * *